(12) United States Patent
Kosinski

(10) Patent No.: US 7,154,212 B1
(45) Date of Patent: Dec. 26, 2006

(54) ACCELERATION INSENSITIVE PIEZO-MICRORESONATOR

(75) Inventor: John A. Kosinski, Neptune, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 227 days.

(21) Appl. No.: 11/031,948

(22) Filed: Jan. 5, 2005

(51) Int. Cl.
*H03H 9/17* (2006.01)
*H03H 9/19* (2006.01)

(52) U.S. Cl. .................. 310/348; 310/324; 310/320; 310/340; 310/347

(58) Field of Classification Search ............... 310/320, 310/324, 340, 347–348
See application file for complete search history.

(56) References Cited

U.S. PATENT DOCUMENTS 5,589,724 A * 12/1996 Satoh et al. ............... 310/348
6,163,101 A * 12/2000 Yoshida et al. ............ 310/348
6,969,942 B1 * 11/2005 Takeshima et al. ........ 310/324
6,972,511 B1 * 12/2005 Akane et al. .............. 310/348

* cited by examiner

*Primary Examiner*—Darren Schuberg
*Assistant Examiner*—J. Aguirrechea
(74) *Attorney, Agent, or Firm*—Michael Zelenka; George B. Tereschuk

(57) ABSTRACT

An acceleration insensitive piezo-microresonator provides substantially reduced acceleration sensitivity with a plano—plano piezo-microresonator, upper gap and lower gap embedded in a rigid structural supporting member holding major surfaces of the piezo-microresonator firm and steady. The piezo-microresonator has neither electrodes on its surfaces nor contacts with any electrodes. Electrodes are doped regions incorporated into the support member. The upper and lower gaps are adjacent to the major surfaces of the piezo-microresonator, permitting it to vibrate freely. The support member surrounds and supports the plano—plano piezo-microresonator plate, upper gap and lower gap, maintaining a constant upper gap height and lower gap height. The electrodes provide a thickness-directed electrical field exciting the piezo-microresonator. A method of desensitizing a resonant frequency of a piezo-microresonator to acceleration stresses is also provided.

20 Claims, 1 Drawing Sheet

ACCELERATION INSENSITIVE PIEZO-MICRORESONATOR

GOVERNMENT INTEREST

The invention described herein may be manufactured, used, and licensed by or for the United States Government for governmental purposes without payment to me of any royalties thereon.

FIELD OF THE INVENTION

The invention relates generally to the field of piezoelectric resonators and more particularly to a piezoelectric resonator whose resonant frequency is unaffected by external acceleration or vibration.

BACKGROUND OF THE INVENTION

Piezoelectric resonators are well known in the art. Piezoelectric resonators are electronic elements used to select and make a frequency stable. Piezoelectric resonators are widely used in various kinds of electronic equipment including communication systems, intelligence sensors, precision guided munitions, cordless telephones, broadcast and television, satellite telecommunication, electronic clocks, digital instruments and so on. Piezoelectric resonators can also be used as sensors of temperature, pressure and weight. One of the shortcomings and limitations with piezoelectric resonators is that they are prone to undesired shifts in resonance frequency when they experience external acceleration or vibration.

The advent of modern personal satellite communications systems has transformed acceleration sensitivity from a military-specific technology barrier to an important concern for commercial systems. The vast majority of communications systems maintain phase coherence by using low-noise oscillators. Commercial off-the-shelf crystal oscillators are capable of meeting nearly all systems requirements, provided that the systems are at rest.

The problem of acceleration sensitivity has been the subject of research for more than 30 years, initially at Bell Labs and Hewlett-Packard, and later at the U.S. Army Electronics Technology and Devices Laboratory and the U.S. Army Research Laboratory. Additional efforts have also been pursued by the U.S. Army Research Office and the French Laboratorie de Chronometrie et Piezoelectric. Yet none of these efforts has succeeded in providing a clear and complete understanding of the fundamental nature of acceleration sensitivity in piezoelectric resonators. As a consequence, previous approaches to reduce acceleration sensitivity that are based on an imperfect understanding of the acceleration phenomenon have been less successful than desired. Such unsuccessful efforts include ring-supported resonators, aspect-ratio compensation, visco-elastic mounting and mode shape modification. Each approach offers a particular set of advantages, but they all suffer from the common disadvantage of excessive acceleration sensitivity. None of these unsuccessful techniques has yet to yield a piezoelectric resonator with acceleration insensitivities repeatedly below $1 \times 10^{-10}/g$.

The stresses caused by acceleration, vibration and shock are well known to those skilled in the art. Periodic acceleration in the form of vibration can cause frequency modulation in piezoelectric resonators, and shock can cause a step frequency change in a piezoelectric resonator due to the typical piezoelectric resonator's acceleration sensitivity. Shock can also cause a permanent frequency change in a piezoelectric resonator if either the supporting structure or the electrodes is stressed beyond their elastic limits. Therefore the stresses caused by acceleration, vibration and shock and the consequent significant effects on piezoelectric frequency instability have caused prior art piezoelectric resonators to suffer from numerous disadvantages, limitations and shortcomings. Current piezoelectric resonators continue to suffer from the long-standing difficulties, shortcoming and limitations associated with excessive acceleration sensitivity and do not provide acceleration insensitivity repeatedly below $1 \times 10^{-10}/g$. Up until now, there has been a long-standing and continuing need for piezoelectric resonators with repeatable acceleration insensitivities on the order of below $1 \times 10^{-10}/g$. Thus, there has been a long-felt need to provide piezoelectric structures that reduce the undesirable and harmful effects of the stresses caused by acceleration, vibration and shock and provide affordable and easy to produce piezoelectric resonators.

The structures of the present invention provide added support and restraint techniques that significantly reduce the undesirable effects of acceleration sensitivity through a plano—plano piezo-microresonator, a plurality of gaps and a rigid structural securing member that can essentially eliminate any excessive sensitivity, without suffering from the long-standing disadvantages, limitations and shortcomings of prior art acceleration sensitive resonators. The piezo-microresonators of the present invention satisfy the long-standing and continuing need for piezoelectric resonators with repeatable acceleration insensitivities on the order of less than $1 \times 10^{-10}/g$ with an acceleration insensitive plano—plano piezoelectric resonator with a predetermined proportionality constant that is supported by a rigid support member, without suffering from the disadvantages, shortcomings and limitations of prior art resonators.

SUMMARY OF THE INVENTION

A thorough mathematical and theoretical analysis of the acceleration sensitivity problem is helpful to better appreciate and comprehend this invention's acceleration insensitive plano—plano piezoelectric resonator.

For example, with the BAW c-mode, one can show that the normal acceleration sensitivity of the simple BAW mode propagating in a rotated Y-cut quartz plate simply supported along rectangular edges is given by the equation:

$$\Gamma = \sum_m^{odd} \sum_n^{odd} -\frac{1}{p}\frac{1}{v_c^2}\frac{96}{\pi^5} \frac{a^2b^2\left[\left(\frac{m}{n}\right)E_{2121}b^2 + \left(\frac{n}{m}\right)F_{2121}a^2\right]}{\gamma_{11}m^4b^4 + \gamma_{33}n^4a^4 + (2\gamma_{13} + 4\gamma_{55})m^2n^2a^2b^2} \times \cos(\alpha_m\delta)\sin(2\beta_p\Delta)\cos(\kappa_n\varepsilon)\frac{\sin(\alpha_m\omega)}{\alpha_m\omega}\frac{1}{h}\frac{\sin(\kappa_n l)}{\kappa_n l} \quad (1)$$

This expression is more easily understood if one considers the only dominant term in the series for which m=n=1, a square resonator with a=b and w=l, fundamental mode operation with p=1, and a large plate span to electrode width ratio where two of the terms can be simplified according to the following expression:

$$\frac{\sin(\alpha_m\omega)}{(\alpha_m\omega)} = \frac{\sin(\kappa_n l)}{(\kappa_n l)} \approx 1 \quad (2)$$

In such a case, and considering that $E_{2121}$ and $F_{2121}$ are approximately two to three times as large as the $y_{ij}$, one finds that the acceleration sensitivity $\Gamma$ simplifies to:

$$\Gamma \approx -\frac{1}{v_c^2}\frac{a^2}{h}\cos(\alpha_m\delta)\cos(\kappa_n\varepsilon)\sin(2\beta_1\Delta) \tag{3}$$

It should be noted that $v_c$ is the c-mode acoustic velocity of approximately 3,000 m/sec. and that $\beta_1$ is the acoustic wave propagation constant:

$$\beta_1 \equiv \frac{2\pi}{\lambda} \tag{4}$$

Referring now to FIG. 1, there is depicted a top view of an illustrative square piezoelectric resonator 10 comprising an electroded region 12 where electrodes are formed on the major surfaces of a quartz plate 11, where $2a$ represents the length of quartz plate 11, $2w$ is the length of electroded region 12 and $2h$ is the thickness of square quartz plate 11, which is shown in cross-section FIG. 2, so that the dimensions of the piezoelectric resonator 10 are $2a \times 2a$ square and $2h$ thick. The electroded region 12 is $2w \times 2w$ square and is displaced from the center of the major surfaces by the distances $\delta$ and $\varepsilon$ along the $x_1$ and $x_3$ axes respectively. The thickness direction center of the acoustic mode for the piezoelectric resonator 10 is offset from the thickness direction center of the quartz plate 11 by a small amount, $\Delta$. The in-plane flexure constants are given by:

$$\alpha_m \equiv \frac{m\pi}{2a} \tag{5}$$

and $$\kappa_n \equiv \frac{n\pi}{2b} = \frac{n\pi}{2a} \tag{6}$$

here and since m=n=1

$$\alpha_1 = \frac{\pi}{2a} = \kappa_1 = \frac{\pi}{2a} \tag{7}$$

The diameter to thickness ratio, R, or span to thickness ratio in this case, can be defined according to the following expression:

$$R \equiv \frac{2a}{2h} = \frac{a}{h} \tag{8}$$

Then $$a = Rh \text{ and } a^2 = R^2 h^2 \tag{9}$$

Combining equations (3) through (9) results in the expression:

$$\Gamma \approx -\frac{1}{v_c^2}R^2 h \cos\left(\frac{\pi}{2}\frac{\delta}{a}\right)\cos\left(\frac{\pi}{2}\frac{\varepsilon}{a}\right)\sin\left(4\pi\frac{\Delta}{\lambda}\right) \tag{10}$$

By definition, $2h = \lambda/2$ whence $\lambda = 4h$ and $$\Gamma \approx -\frac{1}{v_c^2}R^2 h \cos\left(\frac{\pi}{2}\frac{\delta}{a}\right)\cos\left(\frac{\pi}{2}\frac{\varepsilon}{a}\right)\sin\left(\pi\frac{\Delta}{h}\right) \tag{11}$$

Equation 11 demonstrates the fundamental nature of low acceleration sensitivity design, according to a number of salient principles. First, it can be seen that the acceleration sensitivity $\Gamma$ is inversely proportional to the square of the acoustic wave velocity, indicating that the designer should select the highest velocity mode, where possible. Secondly, $\Gamma$ is directly proportional to the square of the diameter-to-thickness ratio, R, suggesting that the designer should minimize the diameter-to-thickness ratio, R. Thirdly, $\Gamma$ is directly proportional to the plate half-thickness, h, indicating that the designer should seriously consider minimizing plate thickness, $2h$, whenever possible. And, $\Gamma$ depends on the relative dimensional tolerances expressed as:

$$\left(\frac{\pi}{2}\frac{\delta}{a}\right), \left(\frac{\pi}{2}\frac{\varepsilon}{a}\right) \text{ and } \left(\pi\frac{\Delta}{h}\right) \tag{12}$$

It is significant to note that $\delta$ and $\varepsilon$ readily can be held to be less than 1 μm with proper photolithographic and fabrication techniques. These tolerances can be further rewritten as:

$$\left(\frac{\pi}{2}\frac{\delta}{Rh}\right), \left(\frac{\pi}{2}\frac{\varepsilon}{Rh}\right) \text{ and } \left(\pi\frac{\Delta}{h}\right) \tag{13}$$

or as $$\left(\pi\frac{\delta}{2R\cdot h}\right) \text{ and } \left(\pi\frac{\varepsilon}{2R\cdot h}\right) \tag{14}$$

for the in-plane tolerances, as compared to $$\left(\pi\frac{\Delta}{h}\right) \tag{15}$$

for the thickness-direction tolerance. It should be further noted that for a quality, energy-trapped piezoelectric resonator with minimum spurious modes, one could expect to use $R \approx 50$. This proves that the relative thickness-direction symmetry tolerance is about 100 times as stringent as the in-plane symmetry tolerances, and as a result one of the key aspects of this invention is a structure of inherently perfect thickness-direction symmetry. However, device frequency often depends on the thickness of the piezoelectric resonator, as does the diameter-to-thickness ratio for a fixed span.

Application of these principles along with a careful balancing of these effects makes it possible to achieve this invention's acceleration insensitive piezoelectric resonator, without suffering from the disadvantages, shortcomings and limitations of prior art excessively acceleration sensitive piezoelectric resonators.

It is an object of the present invention to provide an acceleration insensitive piezo-microresonator.

It is another object of the present invention to provide an acceleration insensitive piezo-microresonator whose resonant frequency is not affected by external acceleration or vibration.

It is still a further object of the present invention is to provide an acceleration insensitive plano—plano piezo-microresonator, having a predetermined proportionality constant and whose resonant frequency is not affected by external acceleration or vibration that can achieve repeatable acceleration sensitivities below $1 \times 10^{-10}/g$.

It is yet another object of the present invention is to provide methods of desensitizing the resonant frequency of a piezo-microresonator with a predetermined proportionality constant to external acceleration or vibration and achieving repeatable acceleration sensitivities below $1 \times 10^{-10}/g$.

These and other objects and advantages are provided by this invention's acceleration insensitive piezo-microresonator comprising a plano—plano resonator having a predetermined proportionality constant, embedded within a rigid structural support member and a plurality of gaps that desensitizes the plano—plano piezo-microresonator against external acceleration or vibration and provides a resonant frequency unaffected by those deleterious external stresses. The plano—plano piezo-microresonator, having flat and parallel major surfaces, is braced and stabilized against acceleration-induced stress and vibration-induced stress and is capable of achieving repeatable acceleration sensitivities below $1 \times 10^{-10}/g$, without suffering from the disadvantages, shortcomings and limitations of prior art resonators.

The lateral profiles of both the piezo-microresonator and the rigid structural securing member are illustrated as rectangular, however, circular and oval geometries are other possible embodiments for this invention. The present invention also contemplates a method for desensitizing the resonant frequency of a piezo-microresonator with a predetermined proportionality constant.

These and other objects, advantages, and features will become readily apparent in view of the following descriptions.

DETAILED DESCRIPTION OF THE DRAWINGS

Figure 1:
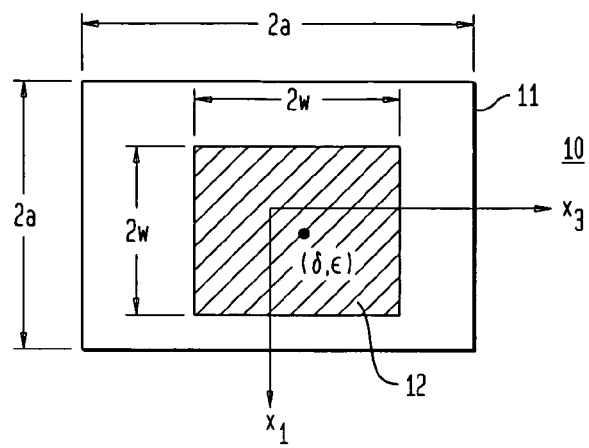
FIG. 1 is a top view of a square piezoelectric resonator.
Figure 2:
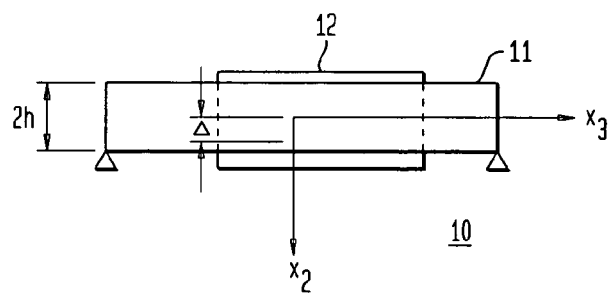
FIG. 2 is cross-sectional view of the square piezoelectric resonator.
Figure 3:
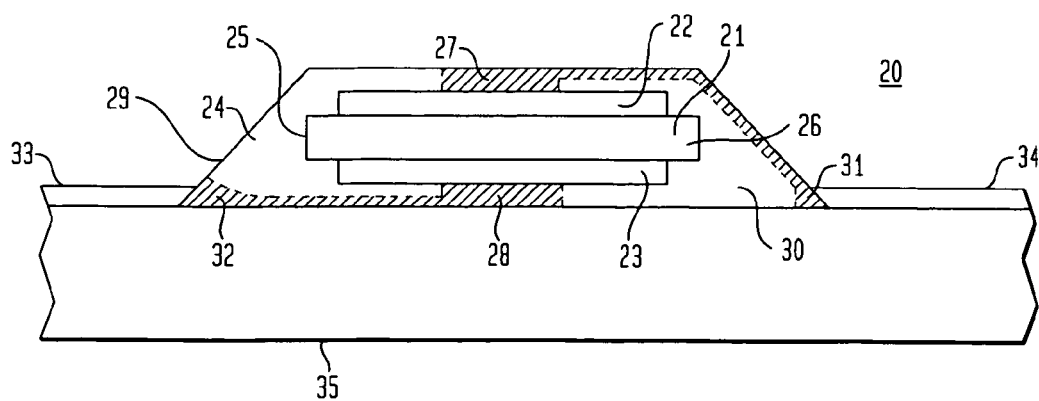
FIG. 3 is a cross sectional view of the acceleration insensitive piezo-microresonator of the present invention.

Referring now to the drawings, FIG. 3 is a cross-sectional view of the acceleration insensitive piezo-microresonator apparatus 20 of the present invention further comprising a plano—plano piezo-microresonator 21 positioned between an upper gap 22 and a lower gap 23, which are all embedded within a rigid structural support member 24. The rigid structural supporting member 24 surrounds the plano—plano piezo-microresonator plate 21, upper gap 22 and lower gap 23 and holds the major surfaces of the piezo-microresonator 21 firm and steady. The piezo-microresonator 21, having a first end 25 and a second end 26, has neither electrodes deposited on its surfaces nor contacts with any electrodes. This electrode-free feature serves to obtain a thickness-direction symmetry of the acoustic mode shape, i.e., $\Delta \to 0$. A corollary requirement for the piezo-microresonator 21 is that the major surfaces should be made flat and parallel. Electrodes 27 and 28 are doped regions incorporated into the first and second portions 29 and 30, respectively, of the support member 24. Electrode 27 is coupled to a first conductive path 31 located in the first region 29 of the support member 24. In a similar fashion, electrode 28 is coupled to a second conductive path 32 located in a second portion 30 of the support member 24. The upper gap 22 and lower gap 23 are adjacent to the major surfaces of the piezo-microresonator 21 and permit the piezo-microresonator 21 to vibrate freely and flex. Electrical connection for the electrodes 27 and 28 to an external circuit may be accomplished with the conductive paths 31 and 32. The contacts between the doped regions forming the electrodes 27 and 28 and the other metal regions in the apparatus are configured to be ohmic.

The support member 24 surrounds and supports the plano—plano piezo-microresonator plate 21, upper gap 22 and lower gap 23 and needs to meet a number of critical requirements. The support member 24 must be structurally rigid with respect to both fixing the first and second ends 25 and 26, respectively, of the piezo-microresonator 21 and maintaining a constant overall height of upper gap 22 and lower gap 23. The support member 24 must also provide adequate structural support for electrodes 27 and 28 and conductive paths 31 and 32. The electrodes 27 and 28 provide a thickness-directed electrical field used to excite piezo-microresonator 21, but other alternate electrode placement arrangements are within the contemplation of this invention.

It is critical that the support member 24 hold the piezo-microresonator 21 firm and steady so that under acceleration the resonator frequency of the piezo-microresonator 21 will not be affected by the load capacitance of the upper gap 22 and lower gap 23, provided that the total overall gap from the upper gap 22 and lower gap 23 remains constant. Under acceleration, this invention's piezo-microresonator 21 may flex substantially, but will exhibit negligible thickness change. Thus, if the positions of electrodes 27 and 28 are rigidly fixed, as is the case in this invention's structure, the total overall gap on both sides of the piezo-microresonator 21 remains constant even as the piezo-microresonator 21 moves within the upper gap 22 and lower gap 23.

The approximate mathematical relationship between the structural elements of this invention's acceleration insensitive piezo-microresonator and the acceleration sensitivity $\Gamma$ is now understood to be:

$$\Gamma = (\text{proportionality constant}) \times (\text{dimensional tolerances}) \quad (16)$$

where the proportionality constant is:

$$-\frac{R^2 h}{v^2} \quad (17)$$

and the dimensional tolerances are, in the general case, combinations and permutations of sines and cosines with arguments as expressed in equations 14 and 15, which are now repeated for the sake of convenience:

$$\left(\pi\frac{\delta}{2R\cdot h}\right) \text{ and } \left(\pi\frac{\varepsilon}{2R\cdot h}\right) \quad (18)$$

for in-plane tolerances, and $$\left(\pi\frac{\Delta}{h}\right) \quad (19)$$

for the thickness direction. Current conventional designs of precision resonators typically feature:

$$R \approx \frac{14 \text{ mm}}{.16 \text{ mm}} \approx 100 \quad (20)$$

where v=3,200 m/sec. and h≈0.16 mm, for a proportionality constant of:

$$-\frac{(100)^2(1.6\times 10^{-4}m)}{(3\times 10^3 m/\text{sec.})^2} \approx -\frac{1.6}{9\times 10^6}\frac{\text{sec}^2}{m} \approx -2\times 10^{-7}\frac{\text{sec}^2}{m} \quad (21)$$

For proper energy trapping to occur, it is unlikely that the diameter-to-thickness ratio, R, can be reduced below 20. Nonetheless, such a reduction also reduces the proportionality constant by a factor of 25 to ≈−1×10⁻⁸ sec²/m. Thus, we can anticipate $10^{-11}$/g of performance from this aspect of the present invention. Additional performance enhancements may also be realized by using a higher frequency, i.e. a thinner resonator. For example, a minimum frequency of 100 MHz for fundamental mode operation is preferred. Such a minimum frequency has the advantage of being practical in the current state-of-the-art, and also further reducing the proportionality constant by a factor of 10 to approximately −1×10⁻⁹ sec²/m. Therefore, one can readily anticipate $10^{-12}$/g performance from the advantageous combination of a small R and an appropriate h. For example, by using an unelectroded plano—plano thickness-shear resonator of approximately 15 µm thickness and a span of approximately 300 µm in accordance with the present invention it is foreseeable that $10^{-12}$/g can be achieved with a high degree of certainty. It should be noted that a reduction of the proportionality constant improves acceleration insensitivity independently of whether the device is fabricated according to tight tolerances. It should also be noted that using a higher velocity thickness extensional mode might provide advantages in acceleration insensitivity provided that other aspects of the mode are compatible with the application.

The use of a plano—plano piezo-microresonator 21 without surface electrodes addresses the important issue of fabrication tolerances because this provides a means of minimizing the (πΔ/h) thickness-direction argument, which has been shown to be intrinsically 2R times larger than the in-plane arguments when dimensional tolerances are comparable. The acceleration insensitive piezo-microresonator device 20 of the present invention also takes into account the difficulties associated with in-plane tolerances by specifying photolithographic processing for the formation and alignment of the electrodes 27 and 28, the support member 24 and other aspects of this invention that contribute to improved in-plane tolerances. In accordance with the present invention, tolerances of:

$$\pi\frac{\Delta}{h} \approx 0 \text{ and} \quad (22)$$

$$\left(\pi\frac{\delta}{2Rh}\right) \approx \pi\frac{0.1\ \mu m}{2\times 20\times 16\ \mu m} \approx \pi\frac{0.1^5}{640} \approx 5\times 10^{-4} \quad (22)$$

are anticipated, which should admit an acceleration sensitivity Γ of about 1×10⁻¹²/g, which is significantly better than the acceleration sensitivity prior art devices.

A number of variations of the acceleration insensitive piezo-microresonator device 20 have also been considered. The support member 24 can be formed in many ways, including polysilicon in this embodiment. The upper gap 22 and lower gap 23 adjacent to the major surfaces of the piezo-microresonator 21 can be evacuated or filled with a suitable gas, such as nitrogen. The electrodes 27 and 28 are formed as conductively doped regions within the polysilicon support member 24. The electrodes 27 and 28 can also provide a lateral field excitation electrical field to excite the piezo-microresonator 21. The electrodes 27 and 28 can also be configured into an electroded region. Electrical connection for the electrodes 27 and 28 to an external circuit may be also accomplished with the metallic traces 33 and 34 located inside substrate 35. These variations and any others are considered to be within the contemplation of the present invention.

The present invention also encompasses a method of desensitizing a resonant frequency of a piezo-microresonator to acceleration-induced stresses, comprising the steps of forming a plano—plano piezo-microresonator with a resonator length, a, a plate thickness, 2h, a given proportionality constant, a predetermined resonant frequency and a plurality of major surfaces, the piezo-microresonator having a diameter-to-thickness ratio, R, between the resonator length, a, and a plate half-thickness, h; positioning the piezo-microresonator between an upper gap and a lower gap of a rigid structural support member, the plurality of major surfaces being flat, parallel and adjacent to the upper gap and lower gap; stacking the support member on a substrate; embedding the piezo-microresonator, upper gap and lower gap within the support member, the support member impinging the plurality of major surfaces to hold the piezo-microresonator; rigidly fixing a pair of electrodes in a first doped region and a second doped region of the support member; generating a thickness-directed electrical field to excite the piezo-microresonator; and providing structurally rigid support to a first and a second end of the piezo-microresonator. In a holding step, holding the piezo-microresonator firm and steady under acceleration and maintaining a constant overall height of the upper gap and the lower gap with the support member, with the predetermined resonant frequency being unaffected by a load capacitance of the upper and lower gaps. In an allowing step, allowing the piezo-microresonator to vibrate freely and flex under acceleration with a minimal thickness change, the proportionality constant being directly proportional to a square of the diameter-to-thickness ratio, R, and the proportionality constant being directly proportional to the plate half-thickness, h, resulting in a reduced acceleration sensitivity and an enhanced energy-trapping characteristic. Numerous variations of the acceleration insensitive piezo-microresonator apparatus and piezo-microresonator also apply to the method of desensitizing a resonant frequency of a piezo-microresonator to acceleration stresses.

It is to be understood that such other features and modifications to the foregoing detailed description are within the contemplation of the invention, which is not limited by this description. As will be further appreciated by those skilled in the art, any number of variations and configurations, as well any number of combinations of circuits, differing materials and dimensions can achieve the results described herein. Accordingly, the present invention should not be limited by the foregoing description, but only by the appended claims.

What I claim is:

1. An acceleration insensitive piezo-microresonator apparatus, comprising:
    a plano—plano piezo-microresonator, having a resonator length, a, a plate thickness, $2h$, a given proportionality constant, a predetermined resonant frequency and a plurality of major surfaces, is positioned between an upper gap and a lower gap of a rigid structural support member;
    said piezo-microresonator, said upper gap and said lower gap being embedded within said support member, said support member being stacked on a substrate;
    said plurality of major surfaces, being flat, parallel and adjacent to said upper gap and said lower gap, are impinged by said support member holding said piezo-microresonator;
    said piezo-microresonator having a diameter-to-thickness ratio, R, between said resonator length, a, and a plate half-thickness, h;
    a pair of electrodes rigidly fixed in a first doped region and a second doped region of said support member provides a thickness-directed electrical field to excite said piezo-microresonator;
    said predetermined resonant frequency being unaffected by a load capacitance of said upper gap and said lower gap;
    said support member provides structurally rigid support to a first end and a second end of said piezo-microresonator, holding said piezo-microresonator firm and steady under acceleration, and maintaining a constant overall height of said upper gap and said lower gap; and
    said piezo-microresonator vibrates freely and flexes under acceleration with a minimal thickness change, said proportionality constant being directly proportional to a square of said diameter-to-thickness ratio, R, and said proportionality constant being directly proportional to said plate half-thickness, h, resulting in a reduced acceleration sensitivity and an enhanced energy-trapping characteristic.

2. The acceleration insensitive piezo-microresonator apparatus, as recited in claim 1, further comprising said piezo-microresonator vibrating freely within said upper gap and said lower gap.

3. The acceleration insensitive piezo-microresonator apparatus, as recited in claim 2, further comprising said minimal thickness change is assumed to be identical to zero for calculation purposes.

4. The acceleration insensitive piezo-microresonator apparatus, as recited in claim 3, further comprising a reduced diameter-to-thickness ratio, R, of about 20 or less.

5. The acceleration insensitive piezo-microresonator apparatus, as recited in claim 4, further comprising said proportionality constant being dependent on a group of relative dimensional tolerances expressed as:

$$\left(\frac{\pi}{2}\frac{\delta}{a}\right), \left(\frac{\pi}{2}\frac{\varepsilon}{a}\right) \text{ and } \left(\pi\frac{\Delta}{h}\right)$$

where said $\delta$ is a distance from a center point of said plurality of major surfaces along an X1 axis of said electroded region, where said $\varepsilon$ is a distance from said center point of the plurality of major surfaces along an X3 axis of said electroded region and said $\Delta$ is a thickness direction center of said piezo-microresonator.

6. The acceleration insensitive piezo-microresonator apparatus, as recited in claim 5, further comprising said upper gap and said lower gap being filled with a suitable gas.

7. The acceleration insensitive piezo-microresonator apparatus, as recited in claim 6, further comprising:
    said $\delta$ being less than 1 μm;
    said $\varepsilon$ being less than 1 μm;
    said piezo-microresonator having a thickness, $2h$, of about 15 μm;
    said piezo-microresonator having a span of about 300 μm; and
    said apparatus providing a reduced acceleration sensitivity of about $1 \times 10^{-12}$/g.

8. An acceleration insensitive piezo-microresonator, comprising:
    a plano—plano piezo-microresonator, having a resonator length, a, a plate thickness, $2h$, a given proportionality constant, a predetermined resonant frequency and a plurality of major surfaces, is positioned between an upper gap and a lower gap of a rigid structural support member;
    said piezo-microresonator, said upper gap and said lower gap being embedded within said support member, said support member being stacked on a substrate;
    said plurality of major surfaces, being flat, parallel and adjacent to said upper gap and said lower gap, are impinged by said support member holding said piezo-microresonator;
    said piezo-microresonator having a diameter-to-thickness ratio, R, between said resonator length, a, and a plate half-thickness, h;
    a pair of electrodes rigidly fixed in a first doped region and a second doped region of said support member provides a thickness-directed electrical field to excite said piezo-microresonator;
    said predetermined resonant frequency being unaffected by a load capacitance of said upper gap and said lower gap;
    said support member provides structurally rigid support to a first end and a second end of said piezo-microresonator, holding said piezo-microresonator firm and steady under acceleration, and maintaining a constant overall height of said upper gap and said lower gap; and
    said piezo-microresonator vibrates freely and flexes under acceleration with a minimal thickness change, said proportionality constant being directly proportional to a square of said diameter-to-thickness ratio, R, and said proportionality constant being directly proportional to said plate half-thickness, h, resulting in a reduced acceleration sensitivity and enhanced energy-trapping characteristic.

9. The acceleration insensitive piezo-microresonator, as recited in claim 8, further comprising said piezo-microresonator vibrating freely within said upper gap and said lower gap.

10. The acceleration insensitive piezo-microresonator, as recited in claim 9, further comprising:
   a one of said pair of electrodes being coupled to a first conductive path;
   said first conductive path being in a first region of said support member;
   another one of said pair of electrodes being coupled to a second conductive path;
   said second conductive path being in a second region of said support member; and
   said piezo-microresonator being electrode-free.

11. The acceleration insensitive piezo-microresonator, as recited in claim 10, further comprising a reduced diameter-to-thickness ratio, R, of about 20 or less.

12. The acceleration insensitive piezo-microresonator, as recited in claim 11, further comprising said proportionality constant being dependent on a group of relative dimensional tolerances expressed as:

$$\left(\frac{\pi}{2}\frac{\delta}{a}\right), \left(\frac{\pi}{2}\frac{\varepsilon}{a}\right) \text{ and } \left(\pi\frac{\Delta}{h}\right)$$

where said $\delta$ is a distance from a center point of said plurality of major surfaces along an X1 axis of said electroded region, where said $\varepsilon$ is a distance from said center point of the plurality of major surfaces along an X3 axis of said electroded region and said $\Delta$ is a thickness direction center of said piezo-microresonator.

13. The acceleration insensitive piezo-microresonator, as recited in claim 12, further comprising:
   establishing an ohmic contact between said pair of electrodes and said first conductive path and said second conductive path;
   said pair of electrodes being an electroded region; and
   said electroded region providing a lateral field excitation.

14. The acceleration insensitive piezo-microresonator, as recited in claim 13, further comprising:
   said $\delta$ being less than 1 μm;
   said $\varepsilon$ being less than 1 μm;
   said piezo-microresonator having a thickness, 2h, of about 15 μm;
   said piezo-microresonator having a span of about 300 μm; and
   said piezo-microresonator providing a reduced acceleration sensitivity of about $1\times10^{-12}$/g.

15. A method of desensitizing a resonant frequency of a piezo-microresonator to acceleration stresses, comprising the steps of:
   forming a plano—plano piezo-microresonator with a resonator length, a, a plate thickness, 2h, a given proportionality constant, a predetermined resonant frequency and a plurality of major surfaces, said piezo-microresonator having a diameter-to-thickness ratio, R, between said resonator length, a, and a plate half-thickness, h;
   positioning said piezo-microresonator between an upper gap and a lower gap of a rigid structural support member, said plurality of major surfaces being flat, parallel and adjacent to said upper gap and said lower gap;
   stacking said support member on a substrate;
   embedding said piezo-microresonator, said upper gap and said lower gap within said support member, said support member impinging said plurality of major surfaces to hold said piezo-microresonator;
   rigidly fixing a pair of electrodes in a first doped region and a second doped region of said support member;
   generating a thickness-directed electrical field to excite said piezo-microresonator;
   providing structurally rigid support to a first end and a second end of said piezo-microresonator from said supporting member;
   holding said piezo-microresonator firm and steady under acceleration and maintaining a constant overall height of said upper gap and said lower gap with said support member, said predetermined resonant frequency being unaffected by a load capacitance of said upper gap and said lower gap; and
   allowing said piezo-microresonator to vibrate freely and flex under acceleration with a minimal thickness change, said proportionality constant being directly proportional to a square of said diameter-to-thickness ratio, R, and said proportionality constant being directly proportional to said plate half-thickness, h, resulting in a reduced acceleration sensitivity and an enhanced energy-trapping characteristic.

16. The method of desensitizing the resonant frequency of a piezo-microresonator to acceleration stresses, as recited in claim 15, further comprising the step of allowing said piezo-microresonator to vibrate freely within said upper gap and said lower gap.

17. The method of desensitizing the resonant frequency of a piezo-microresonator to acceleration stresses, as recited in claim 16, further comprising the step of providing a reduced diameter-to-thickness ratio, R, of about 20 or less.

18. The method of desensitizing the resonant frequency of a piezo-microresonator to acceleration stresses, as recited in claim 17, further comprising the step of forming said proportionality constant to depend on a group of relative dimensional tolerances expressed as:

$$\left(\frac{\pi}{2}\frac{\delta}{a}\right), \left(\frac{\pi}{2}\frac{\varepsilon}{a}\right) \text{ and } \left(\pi\frac{\Delta}{h}\right)$$

where said $\delta$ is a distance from a center point of said plurality of major surfaces along an X1 axis of said electroded region, where said $\varepsilon$ is a distance from said center point of the plurality of major surfaces along an X3 axis of said electroded region and said $\Delta$ is a thickness direction center of said piezo-microresonator.

19. The method of desensitizing the resonant frequency of a piezo-microresonator to acceleration stresses, as recited in claim 18, further comprising the step of forming said support member from polysilicon.

20. The method of desensitizing the resonant frequency of a piezo-microresonator to acceleration stresses, as recited in claim 19, further comprising the steps of:
   forming said $\delta$ to be less than 1 μm;
   forming said $\varepsilon$ to be less than 1 μm;
   forming said piezo-microresonator with a thickness, 2h, of about 15 μm;
   forming said piezo-microresonator to have a span of about 300 μm; and
   providing a reduced acceleration sensitivity of about $1\times10^{-12}$/g.

* * * * *